United States Patent [19]

Ueno

[11] Patent Number: 4,638,264
[45] Date of Patent: Jan. 20, 1987

[54] VOLTAGE CONTROLLED OSCILLATOR WITH SERIES CONNECTED RESONANCE ELEMENT AND SWITCHED CAPACITANCE

[75] Inventor: Moriaki Ueno, Soma, Japan

[73] Assignee: Alps Electric Co., Ltd., Japan

[21] Appl. No.: 814,187

[22] Filed: Dec. 27, 1985

[30] Foreign Application Priority Data

Dec. 27, 1984 [JP] Japan ................. 59-197795[U]

[51] Int. Cl.$^4$ ............................................. H03B 5/00
[52] U.S. Cl. ............................. 331/117 D; 331/36 C; 331/177 V
[58] Field of Search .......... 331/117 D, 177 V, 108 R, 331/36 C; 332/30 V

[56] References Cited

U.S. PATENT DOCUMENTS

| | | | |
|---|---|---|---|
| 3,614,665 | 10/1971 | Weller et al. ...................... | 331/101 |
| 3,679,990 | 7/1972 | Hiday et al. ................. | 331/117 D X |
| 3,959,728 | 5/1976 | Yamazaki et al. .................. | 325/422 |

*Primary Examiner*—Eugene R. LaRoche
*Assistant Examiner*—Robert J. Pascal
*Attorney, Agent, or Firm*—Guy W. Shoup

[57] ABSTRACT

A voltage controlled oscillator of the type wherein a variable capacitance diode is connected in parallel with a distributed parameter line functioning as a resonance circuit, whose capacitance varies in response to voltage control. To vary the resonance wavelength of the distributed parameter line a condenser is connected in series therewith, and the condenser is short-circuited by a switching diode. A coaxial dielectric line, strip line, coaxial cable, etc. may be used as the resonance circuit element by dividing the distributed parameter line into two parts and employing these elements as the divided parts.

4 Claims, 4 Drawing Figures

VOLTAGE CONTROLLED OSCILLATOR WITH SERIES CONNECTED RESONANCE ELEMENT AND SWITCHED CAPACITANCE

BACKGROUND OF THE INVENTION

1. Field of the Invention

This invention relates to an improvement of a voltage controlled oscillator whose oscillation frequency band is changeable.

2. Description of the Prior Art

FIG. 3 shows schematically a portion of a transmitter-receiver for personal radio communication, in which an antenna 1 is connected through an antenna switch 2 to a high-frequency amplifier 3 and transmission power amplifier 5. On the output side of the high-frequency amplifier 3 a first mixer 4 is connected through a transmit-receive switch 6 to a voltage controlled oscillator (hereinafter abbreviated as VCO) 8.

The VCO 8 used in the transmitter-receiver for personal radio communication must operate as a carrier oscillator and modulator at the time of transmission and as a local oscillator for frequency conversion at the time of reception, so it has a configuration by which it supplies an oscillation signal in frequency bands differing between the transmission time and reception time. For this type of VCO, recently, a distributed parameter line of ¼ wavelength resonance mode is used as a resonance circuit, because it makes the circuit configuration simple and provide good grounding for the resonance circuit.

More clearly, the VCO 8 has a known circuit configuration as shown in FIG. 4 which includes a modified Colpitts oscillator, wherein the collector of a transistor 9 forms an amplifying circuit, and a coaxial dielectric line 11 of ¼ wavelength resonance mode and a series circuit consisting of a coupling condenser 12 and variable capacitance diode 13 are provided in parallel and connected with transistor 9 through a Clapp condenser 10. The dielectric line 11 and variable capacitance diode 13 are grounded respectively. The emitter of the transistor 9 is connected through a DC-blocking/coupling condenser 14 to an output terminal 15 for outputting the oscillation signal. Across the emitter-collector a feedback condenser 16 is connected, and across the base-emitter a feedback condenser 18 is connected. To change the frequency band of the oscillation signal between time transmission time and reception, a series circuit consisting of a condenser 23 and switching diode 24 is connected in parallel across the dielectric line 11, and the connection point between the condenser 23 and diode 24 is connected to a transmit-receive switching terminal 25 through a resistor 7. In the drawing, 17 is a grounding condenser, and 19 through 22 are bias resistors.

The operation of the VCO 8 when the transmitter-receiver is in the reception state will now be described.

At the time of reception a voltage lower than the ground potential is applied to the transmit-receive switching terminal 25, so that the switching diode 24 is kept in the non-conducting state and the capacitance Ca of the condenser 23 does not contribute to a parameter which determines the resonance frequency. Thus, a series-parallel circuit formed by the line 11, coupling condenser 12, variable capacitance diode 13, and Clapp condenser 10 becomes inductive as a whole, and by the above series-parallel circuit and feedback condensers 16 and 18 connected in parallel therewith a parallel resonance circuit is formed. Accordingly, as a voltage is applied to a power terminal 26 connected to the base and collector of the transistor 9, the circuit starts to oscillate at the resonance frequency of the above parallel resonance circuit, and the resultant oscillation signal is amplified by the transistor 9 and output through the output terminal 15. This oscillation signal has a frequency (about 961–963 MHz) which is the sum of a frequency of about 903–905 MHz and a first intermediate frequency (about 58 MHz), and is supplied through the switch 6 to the first mixer 4 (see FIG. 3).

On the other hand, a signal (about 903–905 MHz) received by the antenna 1 is, as shown in FIG. 3, amplified by the high-frequency amplifier 3 after passing through the antenna switch 2, and supplied to the first mixer 4. Then, because the received signal is mixed with the oscillation signal given from the VCO 8 in the first mixer 4, the first intermediate frequency of about 58 MHz is output from the mixer 4.

Following the above process, as shown in FIG. 3, a control voltage corresponding to a desired channel frequency is given from a PLL (phase-locked loop) circuit 7 to a control terminal 27 of the VCO 8, and this control voltage is applied to the variable capacitance diode 13, as shown in FIG. 4, to vary the capacitance thereof, so that a capacitance Cc resulting from the combination with the coupling condenser 12 is changed and the frequency of the oscillation signal is set to the desired channel frequency. As a result, it is possible to select the desired channel.

On the contrary, at the time of transmission a positive voltage is applied to the transmit-receive switching terminal 25, so that the switching diode 24 becomes conductive and the capacitance Ca of the condenser 23 is included in the resonance circuit. Thus, the whole resonance capacitance is increased and becomes the sum of Cc+Ct+Ca and capacitances of the feedback condensers 16 and 18. Accordingly, the whole resonance capacitance and dielectric line 11 form the parallel resonance circuit and the capacitance Cc varies in response to the control voltage given from the PLL circuit 7, so that the oscillation signal having the desired channel frequency (within the range of about 903–905 MHz) is obtained as a carrier. This oscillation signal is, after being modulated by a modulation signal supplied to a modulation terminal 28 (see FIG. 3) of the VCO 8, applied through the switch 6 to the transmission power amplifier 5 in which the signal is amplified up to a given power level, and supplied through the antenna switch 2 to the antenna 1, whereby the signal is radiated into the air.

As is apparent from the foregoing description, according to the conventional VCO 8, because the condenser 23 is connected in parallel with the dielectric line 11, the capacitive component Ca of the condenser 23 can be added to the resonance capacitance by making conductive the switching diode 24; thus the frequency band of the oscillation signal can be changed in correspondence to the transmission state and reception state.

The conventional oscillator, however, has the drawback that the sensitivity of the VCO varies in response to switching of the oscillation frequency band if the condenser 23 is connected in parallel with the dielectric line 11 and its capacitance Ca is added to the resonance capacitance.

More clearly, by denoting the minimum value of the capacitance Cc+Ct of the variable capacitance diode 13 by C and an inductance given upon viewing the network of FIG. 4 at point a in the direction opposite to the arrow by L under the condition that the switching diode 24 is non-conducting, the resonance frequency f is represented by the following equation:

$$f = 1/(2\pi \sqrt{LC}) \tag{1}$$

Denoting the maximum value of the capacitance of the variable capacitance diode 13 by $C+\Delta C$ and the resonance frequency in the above state of the diode by $f+\Delta f$ (frequency variation), $\Delta f$ is represented by the following equation:

$$\begin{aligned}\Delta f &= 1/\{2\pi \sqrt{L(C+\Delta C)}\} - 1/\{2\pi \sqrt{LC}\} \\ &= 1/(2\pi \sqrt{LC})(1/\sqrt{1+\Delta C/C} - 1) \\ &= 1/(2\pi \sqrt{LC})\left[\left(1 - \frac{1}{2}(\Delta C/C) + \frac{3}{8}(\Delta C/C)^2 - \frac{15}{48}(\Delta C/C)^3 + \ldots\right) - 1\right]\end{aligned} \tag{2}$$

Because there exists the relation, $\Delta C < C$, the equation (2) can be simplified by omitting the power terms of $\Delta C/C$ as follows:

$$\Delta f = -1/(2\pi \sqrt{LC}) \times \Delta C/(2C) \tag{2'}$$

Thus, the sensitivity $S_1$ is given by $$S_1 = \Delta f/f = -\{\Delta C/(2C)\} \tag{3}$$

On the contrary, under the condition that the switching diode 24 is conducting, the whole resonance capacitance when the variable capacitance diode 13 has the minimum value of capacitance becomes identical to the sum of the above C and Ca (capacitance of the condenser 23), so that the resonance frequency $f_1$ is represented by the following equation:

$$f_1 = 1/\{2\pi \sqrt{L(C+Ca)}\} \tag{4}$$

Similarly, because the whole resonance capacitance when the variable capacitance diode 13 has the maximum value is $C+Ca+\Delta C$ and the resonance frequency in the above state is $f_1+\Delta f_1$ (frequency variation), $\Delta f_1$ is given by $$\Delta f_1 = 1/\{2\pi \sqrt{L(C+Ca)}\} \times \Delta C/\{2(C+Ca)\} \tag{5}$$

Therefore, the sensitivity $S_2$ is represented by the following equation:

$$S_2 = \Delta f_1/f_1 = -[\Delta C/\{2(C+Ca)\}] \tag{6}$$

Accordingly, comparison of the sensitivity $S_1$ with $S_2$ represented respectively by the equations (3) and (6) results in the following relation:

$$|S_1| > |S_2| \tag{7}$$

As is appreciated from the foregoing description, the sensitivity of the VCO becomes high if the VCO 8 is switched to a high oscillation frequency band, whereas it becomes small if the same is switched to a low oscillation frequency band.

SUMMARY OF THE INVENTION

It is the object of the present invention to provide a voltage controlled oscillator (VCO) whose sensitivity is kept unchanged even if its oscillation frequency band is switched.

In brief, a voltage controlled oscillator according to the present invention is characterized in that a distributed parameter line is connected in series with a condenser, with this condenser a switching diode is connected in parallel, and depending upon the diode becoming conductive or non-conductive the resonance wavelength of the distributed parameter line varies, whereby the oscillation frequency band is switched.

DESCRIPTION OF THE PREFERRED EMBODIMENTS

Embodiments of the present invention will now be described with reference to the drawings.

Figure 1:
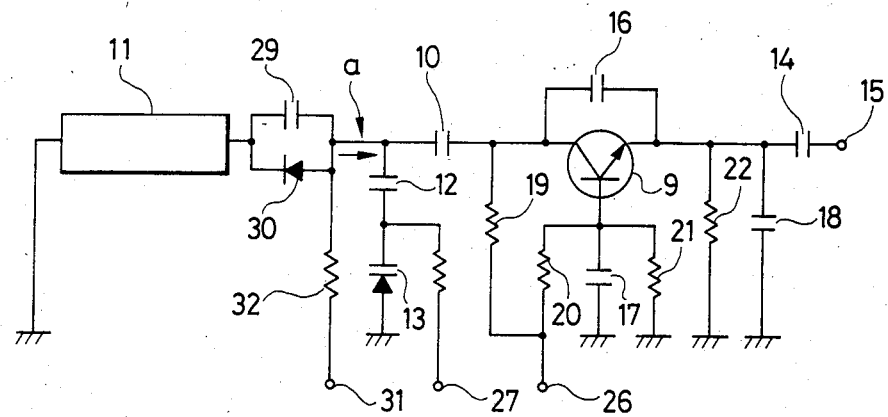
FIG. 1 is a circuit diagram of an embodiment of a voltage controlled oscillator according to the present invention.

A voltage controlled oscillator (VCO) according to the present invention has a circuit configuration of a modified Colpitts oscillator, as shown in FIG. 1, wherein the base of a transistor 9 forming an amplifying circuit is grounded through a grounding condenser 17. The collector of the transistor 9 is connected through a Clapp condenser 10 in series to a resonance wavelength-varying condenser 29 and a coaxial dielectric line 11 of ¼ wavelength resonance mode. Across this condenser 29 a switching diode 30 is connected in parallel, and to the anode side of the diode 30 a switching terminal 31 is connected through a resistor 32. Across a series circuit consisting of the dielectric line 11 and condenser 29, a series circuit consisting of a coupling condenser 12 and variable capacitance diode 13 is connected in parallel. The coupling condenser 12 and variable capacitance diode 13 form a resonance capacitance, and make up a parallel resonance circuit together with the dielectric line 11 and condenser 29. The connection point between the coupling condenser 12 and variable capacitance diode 13 is connected to a control terminal 27. The emitter of the transistor 9 is connected through a DC-blocking/coupling condenser 14 to an output terminal 15 for outputting an oscillation output, and across the emitter-collector a feedback condenser 16 is connected. To the base and collector of the transistor 9 a power terminal 26 is coupled, and a voltage applied to the power terminal 26 is supplied through bias resistors 19 and 20. In the drawing, 18 is a grounding condenser, and 21 and 22 are bias resistors.

The operation of the VCO according to the present invention will now be described.

As a positive voltage is applied to the switching terminal 31, the switching diode 30 becomes conductive, the condenser 29 is short-circuited, and the dielectric line 11 only exists as an impedance element in viewing the network at point a in the direction opposite to the arrow. Thus, a capacitance at point a upon viewing in the direction of the arrow, is given by Cc+Ct, which is the sum of a capacitance Cc resulting from the series-connected coupling condenser 12 and variable capacitance diode 13 and a capacitance Ct of the Clapp condenser 10. This whole resonance capacitance, Cc+Ct, and dielectric line 11 make up the parallel resonance circuit. Accordingly, as a voltage is applied to the power terminal, noise is generated in the transistor 9, and this noise is amplified in the form of the collector current of the transistor 9, and it flows through the parallel resonance circuit, so that this circuit resonates at its intrinsic resonance frequency (about 903 MHz, for example) and commences oscillation. As a result, the oscillation signal is fed back and amplified by the transistor 9 and output through the output terminal 15.

As a voltage lower than the ground potential is applied to the switching terminal 31, the switching diode 30 becomes non-conductive, so that the impedance elements existing in viewing the network at point a in the direction opposite to the arrow are the dielectric line 11 and condenser 29; thus the resonance wavelength of the dielectric line 11 varies depending upon the capacitance of the condenser 29. Further, the whole resonance capacitance is identical to the foregoing "Cc+Ct". Accordingly, the series circuit consisting of the dielectric line 11 and condenser 29 and the whole resonance capacity Cc+Ct make up the parallel resonance circuit, and the resonance frequency of this parallel resonance circuit increases to, for example, 961 MHz. Then, as a voltage is applied to the power terminal 26, noise generated in the transistor 9 resonates at the foregoing frequency to commence oscillation of the circuit; thus the oscillation signal of 961 MHz can be obtained from the output terminal 15.

As is apparent from the foregoing, in the VCO according to the present invention, because the resonance wavelength of the dielectric line 11 is changed by series connection of the condenser 29 and electrical disconnection of the same, the oscillation frequency band can be switched without a change of the resonance capacitance, and the sensitivity does not vary even when the oscillation frequency band is switched.

More clearly, under the condition that the switching diode 30 is conducting, the whole resonance capacitance when the variable capacitance diode 13 has the minimum value of capacitance is Cc+Ct=C and the inductance given upon viewing the network at point a in the direction opposite to the arrow is L, so that the resonance frequency f' is given by the same equation as the foregoing equation (1) as below.

$$f' = 1/(2\pi \sqrt{LC})  \tag{8}$$

The whole resonance capacitance when the variable capacitance diode 13 has the maximum value is $C+\Delta C$ and the resonance frequency in the above state is $f'+\Delta f$ (frequency variation), so that $\Delta f$ is represented by the following equation:

$$\Delta f = -1/(2\pi \sqrt{LC}) \times C/(2C) \tag{9}$$

Thus, the sensitivity $S'_1$ is given by $$S'_1 = \Delta f/f = -\{\Delta C/(2C)\} \tag{10}$$

On the contrary, under the condition that the switching diode 30 is non-conducting, the whole resonance capacitance when the variable capacitance diode 13 has the minimum value is identical to "C", and the inductance given upon viewing the network at point a in the direction opposite to the arrow becomes $L+\Delta L$ because the condenser 29 is connected in series with the dielectric line 11. Thus, the resonance frequency $f_2$ is represented by the following equation:

$$f_2 = 1/\{2\pi \sqrt{(L+\Delta L)C}\} \tag{11}$$

Similarly, because the whole resonance capacitance when the variable capacitance diode 13 has the maximum value is given by $C+\Delta C$ and the resonance frequency in the above state by $f_2+\Delta f_2$ (frequency variation), $\Delta f_2$ is given by $$\Delta f_2 = -1/\{2\pi \sqrt{(L+\Delta L)C}\} \times \Delta C/(2C) \tag{12}$$

Therefore, the sensitivity $S'_2$ is represented by the following equation:

$$S'_2 = \Delta f_2/f_2 = -\{\Delta C/(2C)\} \tag{13}$$

Accordingly, from comparison of the equation (13) with the equation (10) the relation, $S'_1 = S'_2$, results and it can be seen that the sensitivity does not vary even if the oscillation frequency band is switched.

For reference, the above sensitivity, $\Delta f/f'$, $\Delta f_2/f_2$, indicates the ratio of the highest frequency to the lowest frequency oscillatable in each switched oscillation frequency band, not the difference between these highest frequency and lowest frequency. In this connection, in case the VCO according to the present invention is applied to the transmitter-receiver for personal radio communication and if the oscillation frequency band at the time of transmission is set to 905(MHz)−903(MHz)=2(MHz), the oscillation frequency band at the time of reception becomes as $$2(\text{MHz}) \times \frac{(961+963)/2}{(903+905)/2} = 2.128(\text{MHz}).$$

Figure 2:
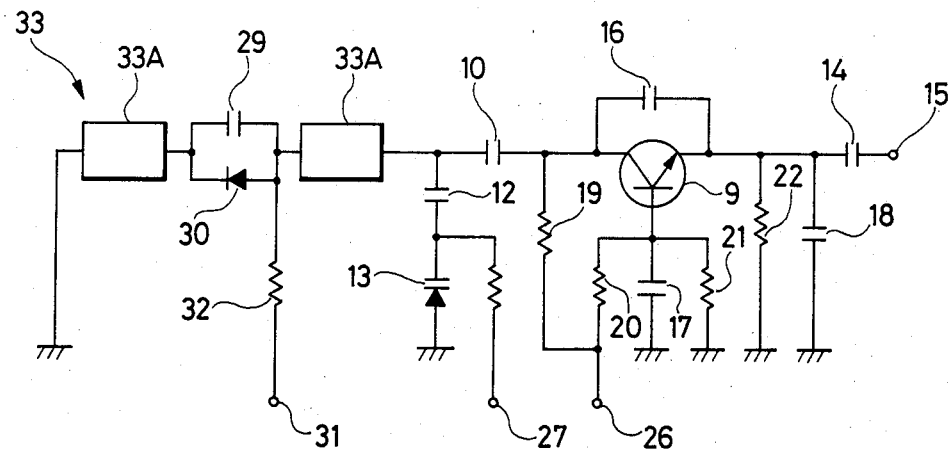
FIG. 2 is a circuit diagram of another embodiment of the voltage controlled oscillator according to the present invention.
Figure 3:
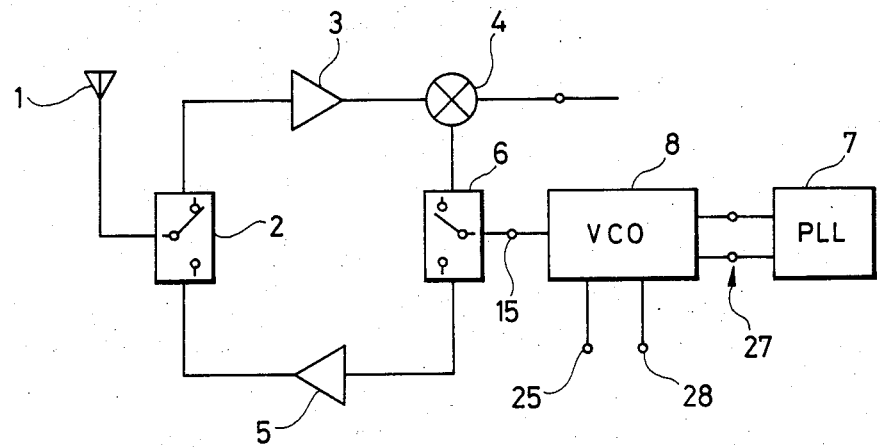
FIG. 3 is a block diagram showing a portion of a transmitter-receiver for personal radio communication.
Figure 4:
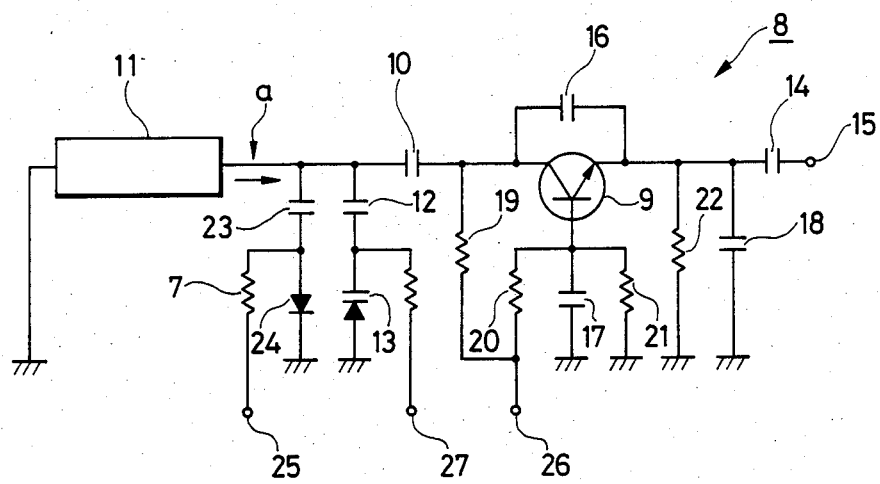
FIG. 4 is a circuit diagram of the conventional voltage controlled oscillator.

FIG. 2 illustrates another embodiment according to the present invention. In this second embodiment, a distributed parameter line 33 of ¼ wavelength resonance mode is divided into two, and between the divided line portions 33A, 33A the parallel circuit consisting of the condenser 29 for varying the resonance wavelength and switching diode 30 is inserted. By the use of the two-divided distributed parameter line 33, it becomes possible to combine arbitrarily the coaxial dielectric line, strip line, coaxial cable, etc. as the respective line portions 33A, 33A thereby to make up the distributed line, whereby a variety of circuit designs can be realized.

As is apparent from the foregoing description, according to the present invention, to the distributed parameter line functioning as the resonance circuit the condenser is connected in series, and across the condenser the switching diode is connected in parallel; thus, the condenser can be disconnected electrically from the distributed parameter line or used as an element which functions so as to vary the impedance of the distributed parameter line, depending upon the diode being conducting or non-conducting, respectively. Therefore, switching of the oscillation frequency band can be achieved without a variation of the resonance capacitance. Accordingly, the present invention can provide the voltage controlled oscillator whose sensitivity is kept unchanged even when the oscillation frequency band is switched.

While the preferred embodiments have been described, variations thereto will occur to those skilled in the art within the scope of the present inventive concepts which are delineated by the following claims.

What is claimed is:

1. A voltage controlled oscillator of the type comprising a distributed parameter line functioning as a resonance circuit, and a variable capacitance diode connected to a connection point in parallel with said distributed parameter line which has its capacitance varied by means of a control voltage, the improvement wherein said distributed parameter line is connected in a series circuit with said connection point through a capacitor and a switching diode in parallel with said capacitor, said switching diode including a terminal for applying a bias voltage for rendering said diode conducting or non-conducting to thereby short-circuit or include said capacitor in said series circuit, respectively, whereby the resonance wavelength of said distributed parameter line can be varied without substantially varying the sensitivity of said oscillator.

2. A voltage controlled oscillator as set forth in claim 1, wherein said distributed parameter line is of ¼ wavelength resonance mode.

3. A voltage controlled oscillator as set forth in claim 1, wherein said distributed parameter line is divided into two portions, and said capacitor and switching diode are connected in series between said divided portions.

4. A voltage controlled oscillator as set forth in claim 3, wherein at least one of said divided line portions is selected from the group consisting of a coaxial dielectric line, a strip line, or a coaxial cable.

* * * * *